(12) United States Patent
Tsai et al.

(10) Patent No.: US 9,299,587 B2
(45) Date of Patent: Mar. 29, 2016

(54) MICROWAVE ANNEAL (MWA) FOR DEFECT RECOVERY

(71) Applicant: Taiwan Semiconductor Manufacturing Company, Ltd., Hsin-Chu (TW)

(72) Inventors: Chun Hsiung Tsai, Xinpu Township (TW); Clement Hsingjen Wann, Carmel, NY (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/250,217

(22) Filed: Apr. 10, 2014

(65) Prior Publication Data

US 2015/0294881 A1    Oct. 15, 2015

(51) Int. Cl.
*H01L 21/324* (2006.01)
*H01L 21/322* (2006.01)
*H01L 21/268* (2006.01)

(52) U.S. Cl.
CPC .......... *H01L 21/324* (2013.01); *H01L 21/2686* (2013.01); *H01L 21/3221* (2013.01)

(58) Field of Classification Search
None
See application file for complete search history.

(56) References Cited

U.S. PATENT DOCUMENTS

| | | | |
|---|---|---|---|
| 6,137,149 A | 10/2000 | Kodama | |
| 6,238,989 B1 | 5/2001 | Huang et al. | |
| 7,030,012 B2 | 4/2006 | Divakaruni et al. | |
| 8,053,273 B2 | 11/2011 | Kammler et al. | |
| 2001/0023108 A1 | 9/2001 | Miyano et al. | |
| 2005/0077570 A1 | 4/2005 | Nishinohara | |
| 2006/0084235 A1 | 4/2006 | Barr et al. | |
| 2006/0088968 A1 | 4/2006 | Shin et al. | |
| 2006/0115933 A1 | 6/2006 | Ye et al. | |
| 2006/0234504 A1 | 10/2006 | Bauer et al. | |
| 2006/0289902 A1 | 12/2006 | Ping et al. | |
| 2007/0259501 A1 | 11/2007 | Xiong et al. | |

(Continued)

FOREIGN PATENT DOCUMENTS

WO    WO2009/039220 A1 *    3/2009

OTHER PUBLICATIONS

Hirai et al. ("Independent control of microwave power and substrate temperature in chemical vapor deposition diamond synthesis.", J. of Materials Science Letters, 10, pp. 330-332, 1991).*

(Continued)

*Primary Examiner* — Yasser A Abdelaziez
(74) *Attorney, Agent, or Firm* — Slater & Matsil, L.L.P.

(57) ABSTRACT

The embodiments of processes and structures described above provide mechanisms for annealing defects by microwave anneal (MWA). MWA causes ionic/atomic (ionic and/or atomic) polarization, electronic polarization, and/or interfacial polarization in a substrate with dopants, damages, and interfaces in crystalline structures. The polarizations make the local temperatures higher than the substrate temperature. As a result, MWA can remove damages at a relatively low substrate temperature than other anneal mechanisms and is able to prevent undesirable dopant diffusion. The relatively low substrate temperature also makes MWA compatible with advanced processing technologies which demands lower substrate temperatures during front-end processing. MWA used in annealing defects (or damages) created in forming source and drain regions improves NMOS transistor performance.

25 Claims, 8 Drawing Sheets

(56) References Cited

U.S. PATENT DOCUMENTS

| | | |
|---|---|---|
| 2007/0287272 A1 | 12/2007 | Bauer et al. |
| 2008/0073667 A1 | 3/2008 | Lochtefeld |
| 2009/0075029 A1 | 3/2009 | Thomas et al. |
| 2009/0267118 A1 | 10/2009 | Chakravarti et al. |
| 2010/0025779 A1 | 2/2010 | Kammler et al. |
| 2011/0117732 A1 | 5/2011 | Bauer et al. |
| 2011/0124169 A1 | 5/2011 | Ye et al. |
| 2011/0212584 A9 | 9/2011 | Chakravarthi et al. |
| 2011/0266617 A1 | 11/2011 | Nakazawa et al. |
| 2011/0269287 A1 | 11/2011 | Tsai et al. |
| 2012/0056245 A1 | 3/2012 | Kang et al. |
| 2012/0282718 A1 | 11/2012 | Lochtefeld |
| 2012/0295421 A1 | 11/2012 | Brabant et al. |
| 2013/0009216 A1* | 1/2013 | Tsai et al. .............. 257/288 |
| 2013/0056795 A1 | 3/2013 | Wu et al. |
| 2013/0157431 A1 | 6/2013 | Tsai et al. |
| 2013/0200455 A1 | 8/2013 | Lo et al. |
| 2013/0307076 A1 | 11/2013 | Chang et al. |
| 2013/0328126 A1 | 12/2013 | Tsai et al. |
| 2014/0094023 A1* | 4/2014 | Lee et al. .............. 438/486 |
| 2014/0131812 A1 | 5/2014 | Wu et al. |
| 2014/0170840 A1 | 6/2014 | Tsai et al. |
| 2015/0001588 A1 | 1/2015 | Gunji et al. |

OTHER PUBLICATIONS

Bauer, M., "High throughput SEG of highly in-situ doped SiCP/SiP layers for NMOS devices using a Si3H8/SiH3CH3/PH3/Cl2 based CDE process," 2012, pp. 499-506, vol. 50, Issue 9, The Electrochemical Society, Prime 2012.

Fischer, P. R. et al., "Low Temperature Silcore Deposition of Undoped and Doped Silicon Films," 2006, pp. 203-215, vol. 3, Issue 2, ECS Transactions.

* cited by examiner

MICROWAVE ANNEAL (MWA) FOR DEFECT RECOVERY

CROSS-REFERENCES TO RELATED APPLICATIONS

The present application is related to U.S. patent application Ser. No. 13/324,331, entitled "Mechanisms for Forming Stressor Regions in a Semiconductor Device," filed on Dec. 13, 2011. The present application is also related to U.S. patent application Ser. No. 14/222,401, entitled "Formation of Dislocations in Source and Drain Regions of FinFET Devices," filed on Mar. 21, 2014. Both above-mentioned applications are incorporated herein by reference in their entireties.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

Semiconductor integrated circuit microelectronic fabrications are formed from semiconductor substrates within and upon which are formed semiconductor devices, and over which are formed patterned conductor layers separated by dielectric layers. Ubiquitous within the fabrication of semiconductor integrated circuit microelectronic fabrications is the use of field effect transistor (FET) devices as switching devices within both logic semiconductor integrated circuit microelectronic fabrications and memory semiconductor integrated circuit microelectronic fabrications. Field effect transistor (FET) devices are ubiquitous within the art of semiconductor integrated circuit microelectronic fabrication for use as switching devices within logic and memory semiconductor integrated circuit microelectronic fabrications. Field effect transistor (FET) devices, in addition to being generally readily fabricated within semiconductor integrated circuit microelectronic fabrications, are also generally readily scalable within semiconductor integrated circuit microelectronic fabrications.

While field effect transistor (FET) devices are thus clearly desirable and essential in the art of semiconductor integrated circuit microelectronic fabrication, the fabrication of field effect transistor (FET) devices with enhanced performance is challenging to achieve while simultaneously decreasing the dimensions. It is within this context the following disclosure arises.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
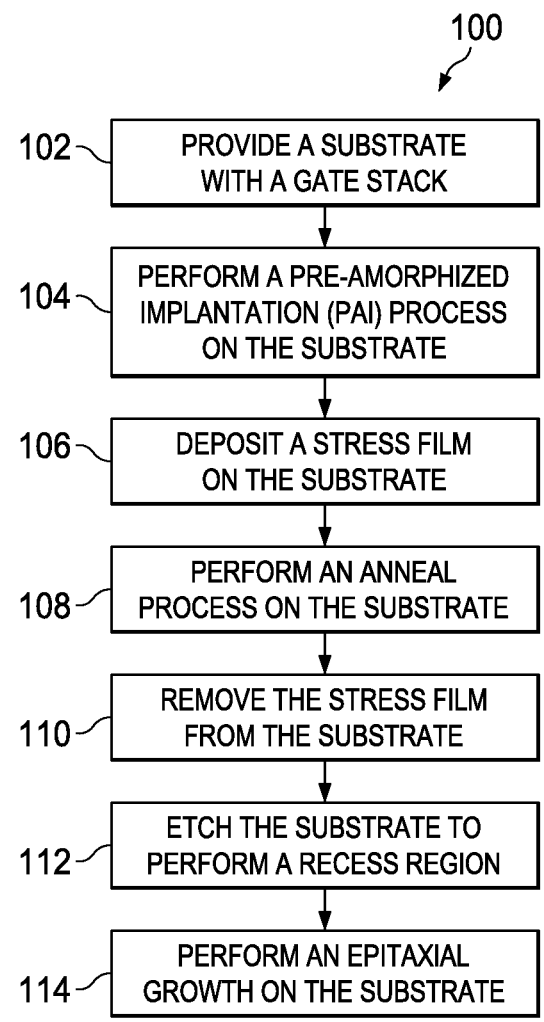
FIG. 1 is a flowchart illustrating a method of forming a semiconductor device according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Examples of devices that can benefit from one or more embodiments of the present invention are semiconductor devices with field-effect transistors (FETs). Such a device, for example, is a complementary metal-oxide-semiconductor (CMOS) field effect transistor. The FETs may be p-type, n-type, or a combination thereof. The FETs may be planar devices or three-dimensional (3D) fin-type field-effect transistors, referred to herein as finFET devices. The plainer devices refer to non-finFET devices. The finFETs are multi-gate transistors or fin-type multi-gate transistors. The finFET device may be a dual-gate device, tri-gate device, and/or other configuration. The devices may be included in an IC such as a microprocessor, memory device, and/or other IC. One of ordinary skill may recognize other embodiments of semiconductor devices that may benefit from aspects of the present disclosure.

The following disclosure will continue with this example to illustrate various embodiments of the present invention. It is understood, however, that the invention should not be limited to a particular type of device, except as specifically claimed.

With reference to FIGS. 1 and 2-4, a method 100 and a semiconductor device structure 200 are collectively described below, in accordance with some embodiments. The semiconductor device structure 200 illustrates an integrated circuit, or portion thereof. In some embodiments, the semiconductor device structure 200 comprises active devices such as metal-oxide-semiconductor field effect transistors (MOSFETs), complementary metal-oxide-semiconductor (CMOS) transistors, finFETS, high voltage transistors, and/or high frequency transistors; other suitable components; and/or combinations thereof. In some embodiments, the semiconductor device structure 200 additionally includes passive components, such as resistors, capacitors, inductors, and/or fuses. In some embodiments, the semiconductor device structure 200 is formed by CMOS technology processing, and thus some processes are not described in detail herein. In some embodiments, additional steps are provided before, during, and after the method 100, and some of the steps described below can be replaced or eliminated, for additional embodiments of the method. In some embodiments, additional features are added in the semiconductor device structure 200, and some of the features described below are replaced or eliminated, for additional embodiments of the semiconductor device structure 200.

Referring to FIG. 1, a method 100 for fabricating a semiconductor device is described according to various aspects of the present disclosure. The method 100 begins with step 102 in which a substrate is provided. The substrate includes a gate structure with a gate stack. The method 100 continues with step 104 in which a pre-amorphous implantation (PAI) process is performed on the substrate. The method 100 continues at step 106 in which a stress film is deposited on the substrate. The method 100 continues at step 108 in which a microwave anneal (MWA) process is performed on the substrate. The method 100 continues at step 110 in which the stress film is removed. The method 100 continues at step 112 in which a recess region is formed on the substrate by etching. The method 100 continues at step 114 in which an epitaxial growth is performed on the substrate. The discussion that follows illustrates various embodiments of a semiconductor device structure 200 that can be fabricated according to the method 100 of FIG. 1.

Figure 2:
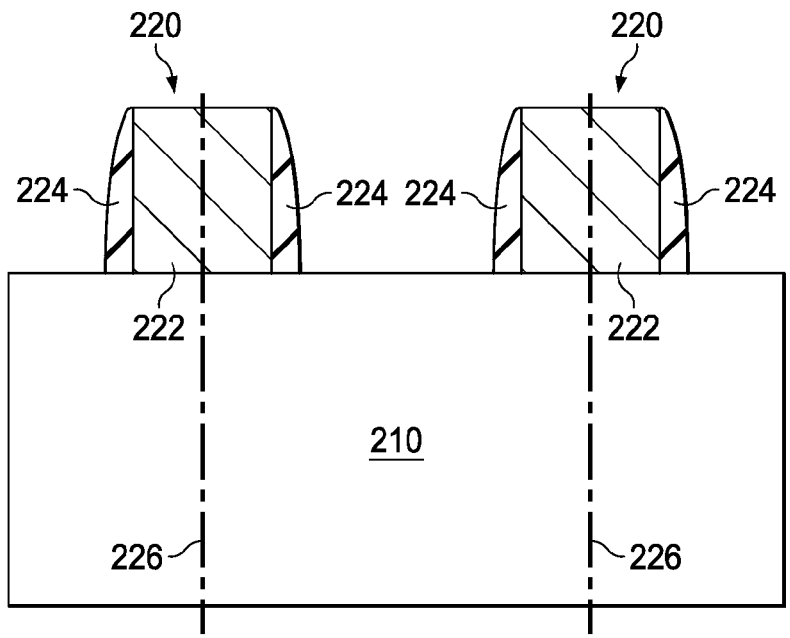
FIGS. 2 to 8 illustrate diagrammatic cross-sectional side views of one or more embodiments of a semiconductor device at various stages of fabrication according to the method of FIG. 1.

FIGS. 2 to 8 illustrate diagrammatic cross-sectional side views of one or more embodiments of a semiconductor device structure 200 at various stages of fabrication according to the method 100 of FIG. 1. Referring to FIG. 2, the semiconductor device structure 200 includes a substrate 210. In the present embodiment, the substrate 210 is a semiconductor substrate including silicon. Alternatively, the substrate 210 includes an elementary semiconductor including silicon and/or germanium in crystal; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In some embodiments, where the substrate 210 is an alloy semiconductor; the alloy semiconductor substrate has a gradient SiGe feature in which the Si and Ge composition change from one ratio at one location to another ratio at another location of the gradient SiGe feature. In some embodiments, the alloy SiGe is formed over a silicon substrate, and/or the SiGe substrate is strained. In yet another alternative, the semiconductor substrate is a semiconductor on insulator (SOI).

The substrate 210 includes various doped regions depending on design requirements as known in the art (e.g., p-type wells or n-type wells). The doped regions are doped with p-type dopants, such as boron or $BF_2$, and/or n-type dopants, such as phosphorus or arsenic. In some embodiments, the doped regions are formed directly on the substrate 210, in a P-well structure, in an N-well structure, in a dual-well structure, or using a raised structure. The doped regions include various active regions, such as regions configured for an N-type metal-oxide-semiconductor transistor (referred to as an NMOS) and regions configured for a P-type metal-oxide-semiconductor transistor (referred to as a PMOS).

In some embodiments, the substrate 210 includes an isolation region to define and isolate various active regions of the substrate 210. The isolation region utilizes isolation technology, such as shallow trench isolation (STI) or local oxidation of silicon (LOCOS), to define and electrically isolate the various regions. The isolation region includes silicon oxide, silicon nitride, silicon oxynitride, other suitable materials, or combinations thereof.

With further reference to FIG. 2, the substrate 210 includes gate structures 220 disposed over channel regions. In some embodiments, the substrate 210 further includes a source region and a drain region on both sides of one of the gate structures 220, the channel region being the region between the source region and the drain region. In some embodiments, lightly-doped drains (LDDs) are formed in substrate 210. In some embodiments, portions of the LDDs are formed under the gate structures 220. For NMOS transistors, N-type lightly-doped drains (LDDs), are formed of n-type dopants, such as phosphorous, arsenic, and/or other group V elements. In some embodiments, P-type pocket doped regions are also formed in substrate 210.

The gate structure 220 includes various gate material layers. In the present embodiment, the gate structure 220 includes a gate stack 222, which includes one or more gate dielectric layers and a gate electrode. In some embodiments, the gate structure 220 also includes gate spacers 224 disposed on sidewalls of the gate stack 222. In some embodiments, the gate structure 220 is divided into two substantially equal halves by an imaginary center line 226. The gate stack 222 is formed over the substrate 210 to a suitable thickness.

The gate dielectric layer(s) of the gate structure 220 may include silicon dioxide. The silicon oxide may be formed by suitable oxidation and/or deposition methods. Alternatively, the gate dielectric layer of the gate structure 108 may include a high-k dielectric layer such as hafnium oxide ($HfO_2$). Alternatively, the high-k dielectric layer may optionally include other high-k dielectrics, such as $TiO_2$, HfZrO, $Ta_2O_3$, $HfSiO_4$, $ZrO_2$, $ZrSiO_2$, combinations thereof, or other suitable material. The high-k dielectric layer may be formed by atomic layer deposition (ALD) and/or other suitable methods.

In some embodiments, the gate stack 222 includes a polycrystalline silicon (or polysilicon) layer. In some embodiments, the polysilicon layer is doped for proper conductivity. Alternatively, the polysilicon is not necessarily doped, for example, if a dummy gate is to be formed and later replaced by a gate replacement process. In some embodiments, the gate stack 222 includes a conductive layer having a proper work function, which is also referred to as a work function layer. The work function layer includes a suitable material, such that the layer is tuned to have a proper work function for enhanced performance of the device.

Exemplary p-type work function metals that may be included in the gate structure 108 include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals that may be included in the gate stack 222 include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the first work function layer is chosen to tune its work function value so that a desired threshold voltage Vt is achieved in the device that is to be formed in the respective region. The work function layer(s) may be deposited by CVD, physical vapor deposition (PVD), and/or other suitable process. The fill metal layer may include Al, W, or Cu and/or other suitable materials. The fill metal may be formed by CVD, PVD, plating, and/or other suitable processes. The fill metal may be deposited over the work function metal layer(s), and thereby filling in the remaining portion of the trenches or openings formed by the removal of the dummy gate structure.

The gate spacers 224 are formed over the substrate 210 by any suitable process to any suitable thickness. The gate spacers 224 include one or more dielectric materials, such as silicon nitride, silicon oxide, silicon oxynitride, other suitable materials, and/or combinations thereof. In some embodiments, the gate spacers 224 are used to offset subsequently formed doped regions, such as heavily doped source/drain regions.

Figure 3:
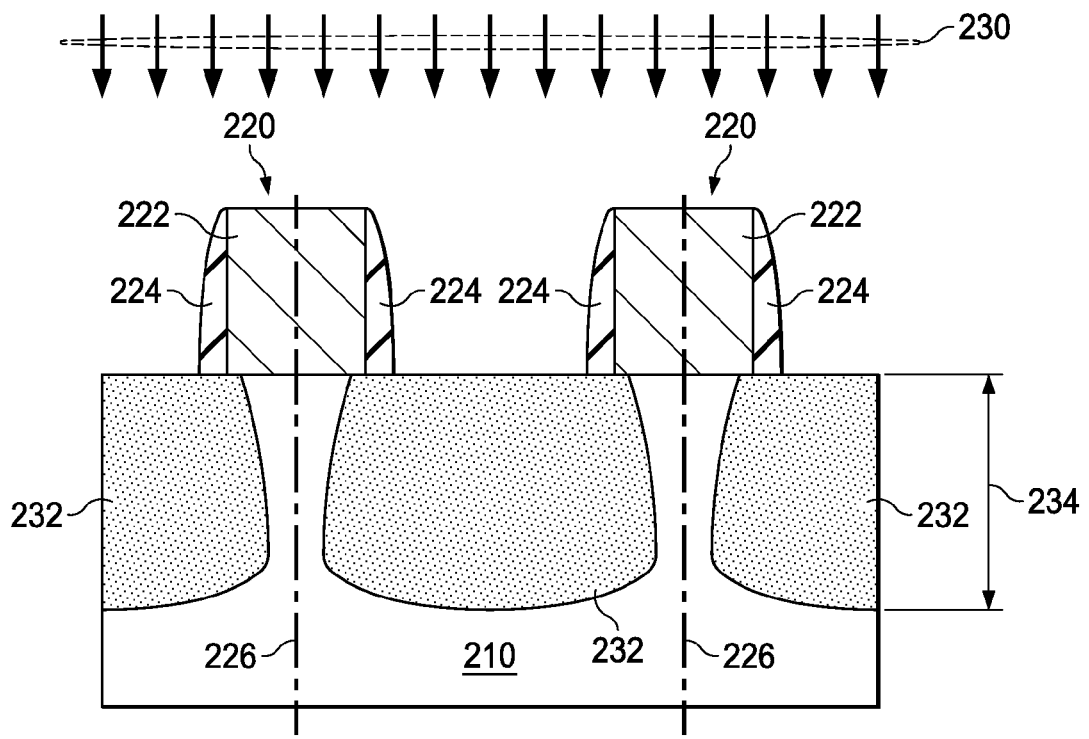

Referring to FIG. 3, a pre-amorphous implantation (PAI) process 230 is performed on the substrate 210. The PAI process 230 implants the substrate 210 with some species. The implanted species damage the lattice structure of the substrate 210 and form an amorphized region 232. In some embodiments, the implanted species scatter in substrate 210. The scattered species cause lateral amorphization, which results in amorphized region 232 extending to regions underneath the spacers 224. In some embodiments, the amorphized region 232 is formed in a source and drain region of the semiconductor device structure 200 and does not extend beyond the center line 226 of the gate structure 220. The amorphized region 232 has a depth 234. The amorphized depth 234 is formed according to design specifications. In some embodiments, the amorphized depth 234 is in a range from about 30 nm to about 150 nm. In some embodiments, the amorphized depth 234 is less than about 100 nm.

In some embodiments, the amorphized depth 234 is controlled by the thickness of the gate spacers 224, because the gate spacers 224 serve to concentrate the PAI process 230 implantation energy away from the center line 226 of the gate structure 220, thereby allowing for a deeper amorphized depth 234. In addition, the amorphized depth 234 is controlled by parameters of the PAI process 230, such as implant energy, implant species, and implant dosage, etc. The PAI process 230 implants the substrate 210 with silicon (Si) or germanium (Ge), in accordance with some embodiments. In some embodiments, other implant species heavier than Si are used. For example, in some embodiments, the PAI process 230 utilizes other implant species, such as Ar, Xe, $BF_2$, As, In, other suitable implant species, or combinations thereof. In some embodiments, the PAI process 230 implants species at an implant energy in a range from about 20 KeV to about 60 KeV. In some embodiments, the PAI process 230 implants species at a dosage ranging in a range from about $1\times10^{14}$ atoms/cm$^2$ to about $2\times10^{15}$ atoms/cm$^2$ depending on the implantation temperature. Lower implantation temperature enhances implant amorphization efficiency. In some embodiments, the implant temperature is in a range from about $-100°$ C. to about 25° C. (or room temperature).

In some embodiments, a patterned photoresist layer (not shown) is utilized to define where the amorphized region 232 is formed and protect other regions of the semiconductor device structure 200 from implantation damage. For example, the PMOS regions are protected. In addition, the patterned photoresist layer exposes the source/drain regions, such that the source/drain regions are exposed to the PAI process 230 (forming amorphized region 232) while the gate structure 220 (and other portions of the semiconductor device structure 200) are protected from the PAI process 230. Alternatively, a patterned hard mask layer, such as a SiN or SiON layer, is utilized to define the amorphized region. In some embodiments, the patterned photoresist layer or the patterned hard mask layer is part of the current manufacturing process, for example lightly-doped drains (LDD) or source/drain formation, thereby minimizing cost as no additional photoresist layer or hard mask is required for the PAI process 230. After the PAI process is performed, the photoresist on substrate 210 is removed.

Figure 4:
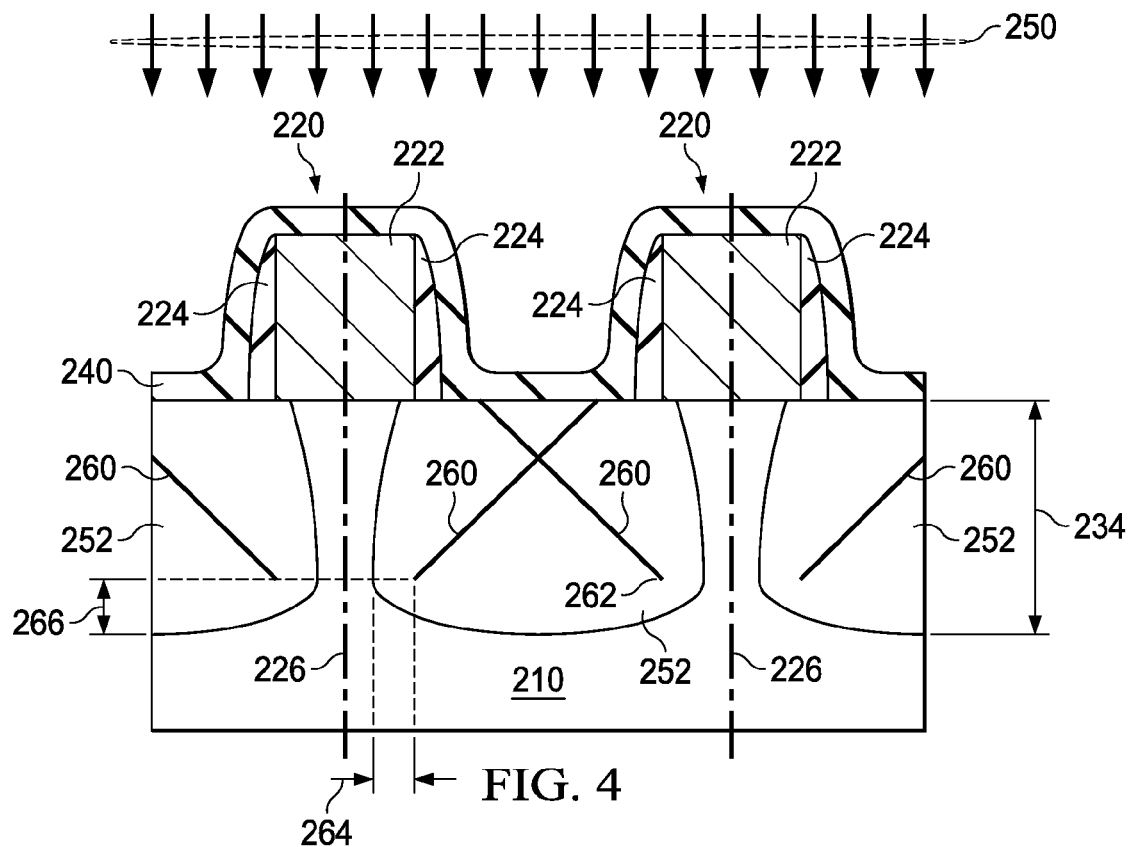

Referring to FIG. 4, a stress film 240 is deposited over the substrate 210. In some embodiments, the stress film 240 is formed by chemical vapor deposition (CVD), physical vapor deposition (PVD), atomic layer deposition (ALD), high density plasma CVD (HDPCVD), plating, other suitable methods, and/or combinations thereof. In some embodiments, the stress film 240 includes a dielectric material, such as silicon nitride, silicon oxide, silicon oxynitride, other suitable materials, and/or combinations thereof. The stress film 240 has tensile stress, which affects the recrystallization process. For example, the stress film 240 could retard the growth rate in the [110] direction of the stressor regions 252. In some embodiments, the stress film 240 is not used.

Still referring to FIG. 4, an annealing process 250 is performed on the substrate 210. The annealing process 250 causes the amorphized regions 232 to recrystallize, forming stressor regions 252. This process is often referred to as solid-phase epitaxy (SPE), and thus, the stressor regions 252 are referred to as epi regions. The stressor regions 252 are, for example, epitaxial SiP stressor regions, epitaxial SiC, or SiCP stressor regions, in accordance with some embodiments. SiC stands for carbon-containing silicon and SiCP stands for carbon-and-phosphorous-containing silicon. In some embodiments, the carbon concentration is less than about 3 atomic %. In some embodiments, the P concentration is in a range from about 2E20/cm$^3$ to about 4E21 l/cm$^3$. In some embodiments, the P and/or C in silicon in the epitaxial stressor regions are implanted at previous operations. In some embodiments, carbon is implanted into a silicon substrate to create a SiC stressor, which is compressive and applies a tensile strain to the NMOS transistor channel region due to the small size of carbon (C) in comparison to silicon (Si). In addition, in some embodiments, the compressive film stress in the stressor regions assists the initiation of pinchoff. In some embodiments, P is doped to lower the resistance of the source and drain regions. In addition, in some embodiments, carbon impedes the out-diffusion of P.

Figure 9:
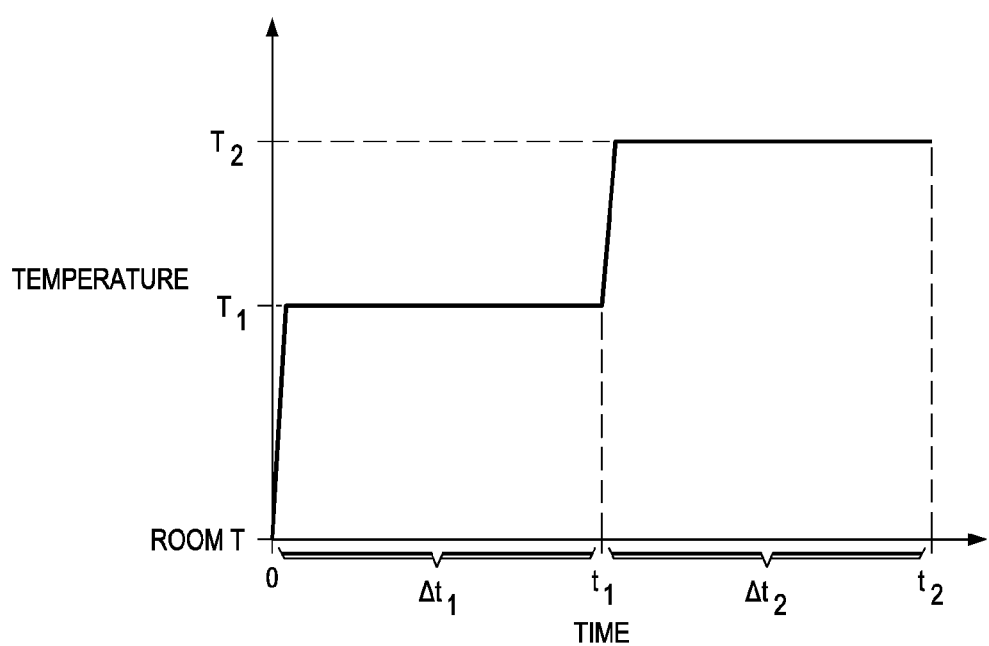
FIG. 9 shows a 2-stage anneal process, in accordance with some embodiments.

In some embodiments, the annealing process 250 is a microwave anneal (MWA) process. In some embodiments, the annealing process 250 is a multi-stage process. In some embodiments, the annealing process 250 includes two stages, as shown in FIG. 9. FIG. 9 shows that the first stage of the MWA is operated at a temperature $T_1$ for a duration of about $\Delta t_1$ and for the second stage is at a temperature T2 for a duration about $\Delta t_2$. $T_1$ is in a range from about 350° C. to about 500° C. and $T_2$ is in a range from about 500° C. to about 600° C., in some embodiments. $T_2$ is greater than $T_1$. The process time ($\Delta t_1$) for the first stage is in a range from about 50 seconds to about 100 seconds and the process time ($\Delta t_2$) for the second stage is in a range from about 50 seconds to about 180 seconds, in some embodiments. The temperatures $T_1$ and $T_2$ described here refer to substrate temperatures.

For advanced device manufacturing that prohibits high temperature processing at this process operation, a MWA process may be used for the annealing process. MWA process can be tuned to locally increase temperature of a particular structure, layer, or region, such as amorphized regions 232, to a much higher value than the substrate or other surrounding structures, layers, or regions. For example, the amorphized regions 232 have dopants and crystalline structures that are different from the surrounding substrate 210. As a result, the amorphized region 232 could be heated up to a higher temperature than substrate 210 by microwave (MW).

Figure 10A:
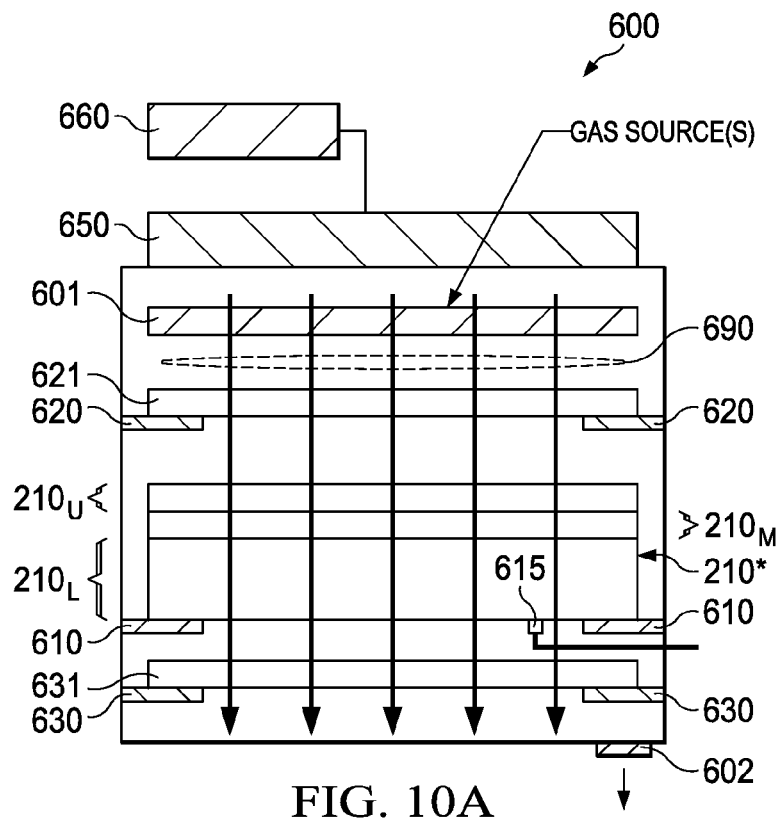
FIGS. 10A-10D show cross-sectional views of a microwave anneal (MWA) system with a substrate under various stages of a MWA process, in accordance with some embodiments.
Figure 10B:
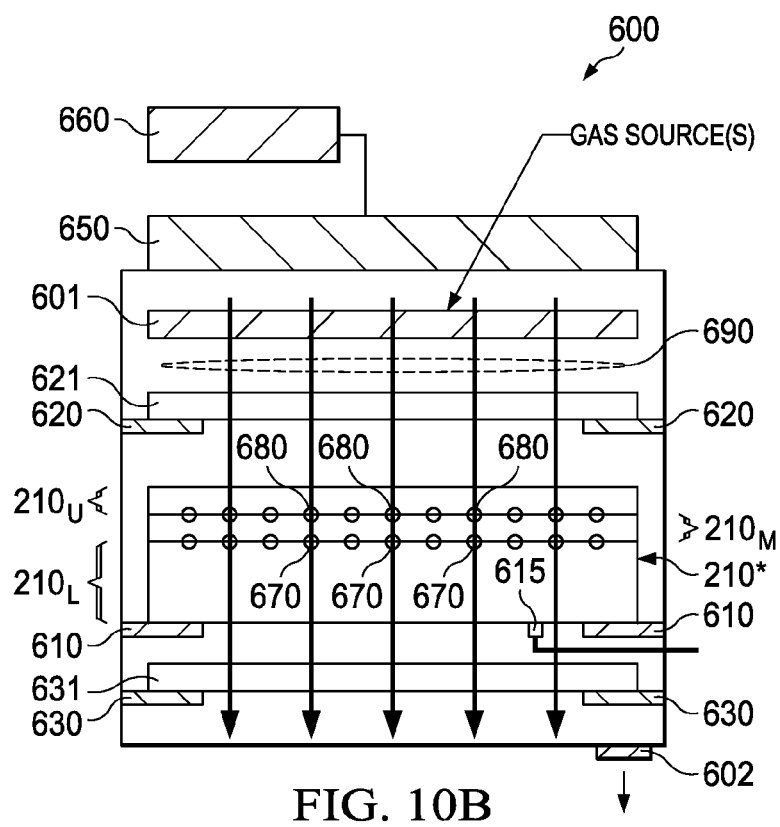
Figure 10C:
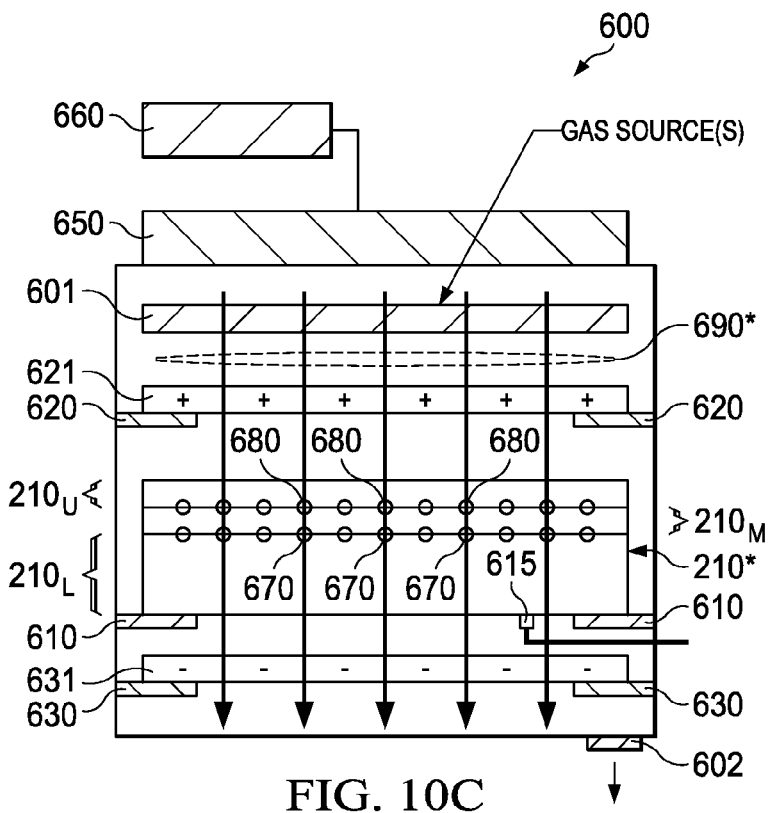

FIGS. 10A-10D show cross-sectional views of a microwave anneal (MWA) system 600 with a substrate 210* under various stages of a MWA process (250), in accordance with some embodiments. Substrate 210* includes semiconductor device structure 200, as described in FIG. 4 prior to the annealing process 108. In FIGS. 10A-10C, the cross-sectional view of substrate 210* is simplified to include an upper portion $210_U$, a middle portion $210_M$ and a lower portion $210_L$. The upper portion $210_U$ includes gate structures 220 and stress film 240, as shown in FIG. 4. The middle portion $210_M$ includes amorphized regions 232 (as shown in FIG. 3) or stressor regions 252 (as shown in FIG. 4) after the annealing process is completed. The lower portion $210_L$ is mainly made of substrate 210.

FIG. 10A shows an MWA system 600 with a substrate holder(s) 610, an upper susceptor holder(s) 620, and a lower susceptor holder(s) 630, in accordance with some embodiments. Substrate 210* is placed on and supported by substrate holder 610, which can be a continuous piece or with openings. In some embodiments, the substrate holder 610 supports the edge portion of substrate 210*, as shown in FIG. 10A. In some other embodiments, the substrate holder 610 supports the majority of backside surface of substrate 210*. The MWA system 600 includes a substrate temperature sensor 615. In some embodiments, the substrate temperature sensor 615 is embedded in the substrate holder 610, as shown in FIG. 10A.

Each of the upper susceptor holder(s) 620 and the lower susceptor holder(s) 630 support a susceptor 621 or a susceptor 631 respectively. In some embodiments, susceptors 621 and 631 are made of semiconductor materials, such as doped Si or SiC. In some embodiments, susceptors 621 and 631 are made of an energy converting material (ECM) with a loss tangent in a range from about 0.1 to about 2. Loss tangent is defined as the ratio (or angle in a complex plane) of the loss reaction to an applied electric field (E).

Both the distance $D_1$ between the bottom surface upper susceptor 621 and the top surface of substrate 210* (the surface neighboring the upper susceptor) and the distance $D_2$ between the top surface of lower susceptor 621 and the bottom surface of substrate 210* (the surface neighboring the lower susceptor) are kept small to prevent heat loss from substrate 210* and susceptors 621 and 631. In some embodiments, each of $D_1$ and $D_2$ is in a range from about 3 mm to about 15 mm.

FIG. 10A shows that there is a gas distributor 601, in some embodiments. During the annealing process, an anneal gas (or gas mixture) could be supplied to the annealing system 600 via gas inlet 601 and exits through a gas outlet 602. The gas inlet 601 is connected to gas source(s). In some embodiments, the anneal gas includes an inert gas, such as He, Ar, $N_2$, etc.

MWA system 600 also includes a microwave inlet 650, which is coupled to a microwave generator 660. FIG. 10A shows the microwave inlet 650 is disposed on the top of system 600. However, the microwave inlet 650 may also be placed in other locations, such as bottom, side, or a combination of different locations. In some embodiments, temperature sensor 615 is coupled to a controller (not shown) for the microwave generator 660. In some embodiments, the substrate temperature is used to control the operation of the microwave generator 660.

After substrate 210* is placed in the MWA system 600, the first stage of MWA process (250), which correlates to the first stage of the 2-stage anneal process described in FIG. 59, starts with microwave being turned on. Prior to turning on the microwave, an anneal gas in supplied into the system. The frequency of microwave supplied to MWA system 600 is in a range from about 3 GHz to about 30 GHz, in some embodiments. In another embodiment microwave frequency is in a range from about 5 GHz to about 10 GHz. However, other applicable frequencies may also be used. The power of microwave is in range from about 3000 watts to about 7000 watts. As described above in FIG. 9, the process time ($\Delta t1$) for the first stage is in a range from about 50 seconds to about 100 seconds, in some embodiments. The temperature (substrate temperature) of the first stage MWA is in a range from about 350° C. to about 500° C., in accordance with some embodiments.

As mentioned above, the MWA process is tuned to locally increase temperature of a particular structure, layer, or region, such as amorphized regions 232, to a much higher value than the substrate or other surrounding structures, layers, or regions. The amorphized regions 232 have dopants and crystalline structures that are different from the surrounding substrate 210. As a result, the amorphized region 232 could be heated up to a higher temperature than substrate 210 by microwave (MW).

The local higher temperature may be caused by ionic/atomic (ionic and/or atomic) polarization, electronic polarization, and/or interfacial polarization heating mechanism under the electric field of microwave. Ionic/atomic polarization is caused by the displacement of positive and/or negative ions or atoms (polarized) within molecules and/or displacement of crystal structure(s) from equilibrium lattice sites. For example, crystalline Si with dopants, such as SiP (silicon doped with P), SiGeB (Si doped with Ge and B) could increase temperature by this mechanism. Ionic/atomic polarization is prominent at a temperature in a range from about room temperature (RT) to about 300° C. Electronic polarization is caused by displacement of electrons with respect to the nuclei upon the application of an external electric field (from microwave). Electronic polarization is prominent at a temperature in a range from about room temperature (RT) to about 500° C. The local higher temperature during the first annealing stage is likely caused by ionic/atomic polarization and electronic polarization.

During the first stage of the MWA process, the applied microwave enable solid phase epitaxial regrowth (SPER) in the amorphized regions 232 to recover most the damages and defects in the amorphized regions 232. The first stage MWA process leaves some residual defects mainly at the interfaces between substrate 210 and boundaries of the amorphized regions 232 and at the interfaces between amorphized regions 232 and gate structures 220 and stress film 240. During this stage, the microwave, illustrated by arrows 690 in FIG. 10A, penetrates through the upper susceptor 621, substrate 210*, and lower susceptor 631, in accordance with some embodiments. Arrows 690 in FIG. 10A illustrate microwave in one direction to show it penetrating the susceptors 621 and 631. In reality, microwave oscillates and changes its direction in 180 degrees.

FIG. 10B shows a simplified illustration of defects 670 at the interfaces between a lower portion $210_L$ (substrate 210)

and the middle portion $210_M$ (boundaries of the amorphized regions 232) and defects 680 at the interfaces between the middle portion $210_M$ (amorphized regions 232) and the upper portion $210_U$ (gate structures 220 and stress film 240). During this stage, the microwave penetrates through the upper susceptor 621, substrate 210*, and lower susceptor 631. With the residual defects 670 and 680, a second stage MWA with a higher annealing temperature is needed. The second stage MWA is used to anneal (or remove) the interfacial defects.

Interfacial polarization could be caused by free charges accumulated at interfaces located within a material, such as grain and/or phase boundaries, or in defect regions in the material under the electric field of microwave. Interfacial polarization could also be caused by free charges accumulated at the interfaces between different materials. This mechanism is prominent at a temperature equal to or greater than about 500° C. The local temperature for effective interfacial annealing needs to be in a range from about 1000° C. to about 1200° C. Therefore, the MWA needs to be tuned to operate at a temperature equal to or greater than about 500° C.

The second stage of MWA process (250) correlates to the second stage of the 2-stage anneal process described in FIG. 9. The frequency of microwave supplied to MWA system 600 is maintained at the same value of the first stage MWA process, in some embodiments. However, the frequency at the second stage could be different from the first stage. The power of microwave is in range from about 5000 watts to about 10000 watts. As described above in FIG. 9, the process time ($\Delta t2$) for the second stage is in a range from about 50 seconds to about 180 seconds, in some embodiments. The temperature (substrate temperature) of the second stage MWA is in a range from about 500° C. to about 600° C., in accordance with some embodiments. Under such process condition, the local temperature of the regions with interfacial defects (the middle portion $210_M$ including amorphized regions 232) is raised to a range from about 1000° C. to about 1200° C.

FIG. 10C shows that during the second stage, a conduction field is formed between the two susceptors 621 and 631, in accordance with some embodiments. One of the two susceptors 621 and 631, such as susceptor 621, become positively charged and the other susceptor, such as susceptor 631, becomes negatively charged. During this stage, the conduction field, illustrated by arrows 690* in FIG. 10C, penetrates through substrate 210*. Arrows 690* in FIG. 10C illustrate the conduction field in one direction. In reality, microwave oscillates and changes its direction in 180 degrees.

The substrate temperature of the second stage MWA in a range from about 500° C. to about 600° C. and the local temperature in the range from about 1000° C. to about 1200° C. are achieved with the usage of susceptors 621 and 631 under the processing condition described above and also with the presence of defects 670 and 680.

Figure 10D:
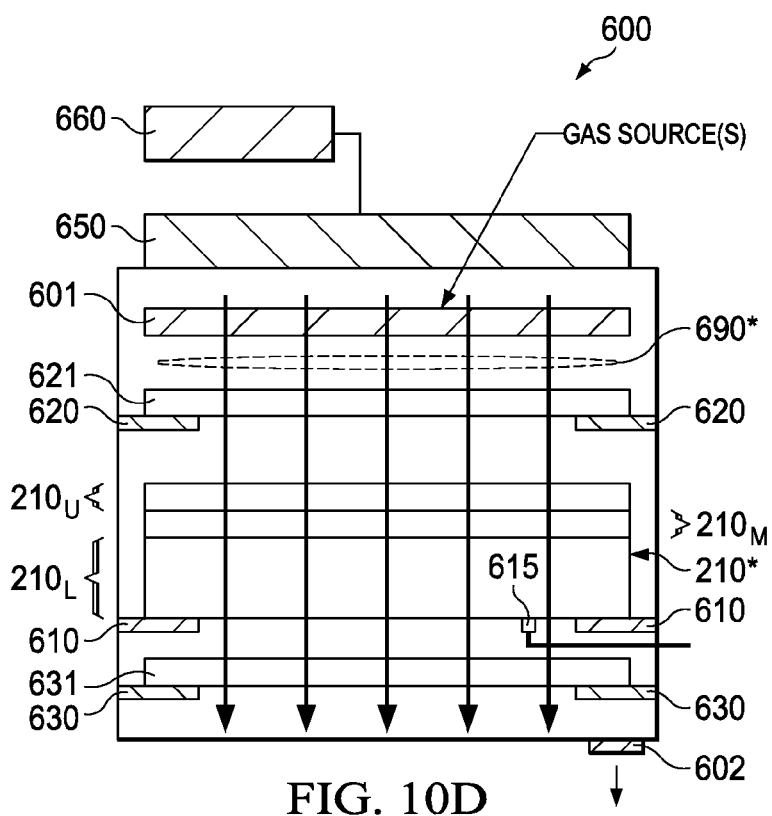

FIG. 10D shows that at the end of the second stage MWA, in some embodiments. The majority or all of defects 670 and 680 have been removed by the second stage MWA. Defects 670 and 680 are removed by the high local anneal temperature, which is in a range from about 1000° C. to about 1200° C. Defect removal by the MWA process described above is much more effective than conventional annealing process. For example, the defect density of a crystalline structure (or layer) after a conventional anneal could be in a range from about 1E9 l/cm² to about 1E12 l/cm². The post MWA anneal defect density could be reduced to less than about 1E7 l/cm², which is the detection limit for TEM.

As mentioned above, the substrate temperature of the first stage MWA is in a range from about 350° C. to about 500° C. and the substrate temperature of the second stage MWA is in a range from about 500° C. to about 600° C. When the substrate temperature is equal to or less than about 600° C., the dopants are not likely to diffuse. In contrast, other annealing processes, without the capabilities of increasing the local temperature, increase the substrate temperatures to higher temperatures, such as from about 800° C. to about 1100° C., which causes dopant diffusion and makes it challenging to control dopant profiles. Further, for advanced processing technologies using higher composition of Ge and SiGe, or using GeSn for epitaxial material, processing temperature needs to be kept low, such as equal to or less than about 600° C. for GeSn, MWA's capability of using high local temperature for annealing while keeping substrate temperature low is very beneficial to advanced processing technologies, which demand lower front-end processing temperatures.

The MWA process described above in FIGS. 9, and 10A-10D illustrates a 2-stage anneal process. However, the MWA process (250) could have more than 2 stages. For example, the MWA process could be 3 stages or more.

In some embodiments, the MWA process (250) may also be used with in combination with other non-MW process(es), such a rapid thermal annealing (RTA) process, a millisecond thermal annealing (MSA) process (for example, a millisecond laser thermal annealing process), or a micro-second thermal annealing (µSA) process. In some embodiments, the annealing process includes a pre-heat operation which minimizes or even eliminates end of range (EOR) defects, which are the remained defects at the amorphous/crystalline interface. The pre-heat operation is performed at a temperature from about 200° C. to about 600° C., in accordance with some embodiments. The pre-heat operation is performed by a non-MW process in a range from about 10 seconds to about 10 minutes, in some embodiments. The pre-heat operation can be conducted before the multi-stage MWA described above. The pre-heat operation is also part of the anneal process 250.

During the annealing process 250, as the substrate 210 recrystallizes, dislocations 260 are formed in the stressor region 252. In some embodiments, the dislocations 260 are formed in the [111] direction. In some embodiments, the [111] direction has an angle in a range from about 45 to about 65 degrees, the angle being measured with respect to an axis parallel to a surface of the substrate 210.

The dislocations 260 start formation at pinchoff points 262. In some embodiments, the pinchoff points 262 are formed in the stressor region 252 at a depth of about 10 to about 150 nanometers, the depth being measured from the surface of the substrate 210. The pinchoff points 262 have a horizontal buffer 264 and a vertical buffer 266. The horizontal buffer 264 and the vertical buffer 266 are formed according to design specifications and are affected by the annealing process 250. The pinchoff points 262 have a horizontal buffer 264 of about 5 to about 20 nanometers and a vertical buffer 266 of about 10 to about 40 nanometers, in some embodiments. In some embodiments, the pinchoff points 262 are formed such that the pinchoff points 262 are not disposed within the channel region.

Figure 5:
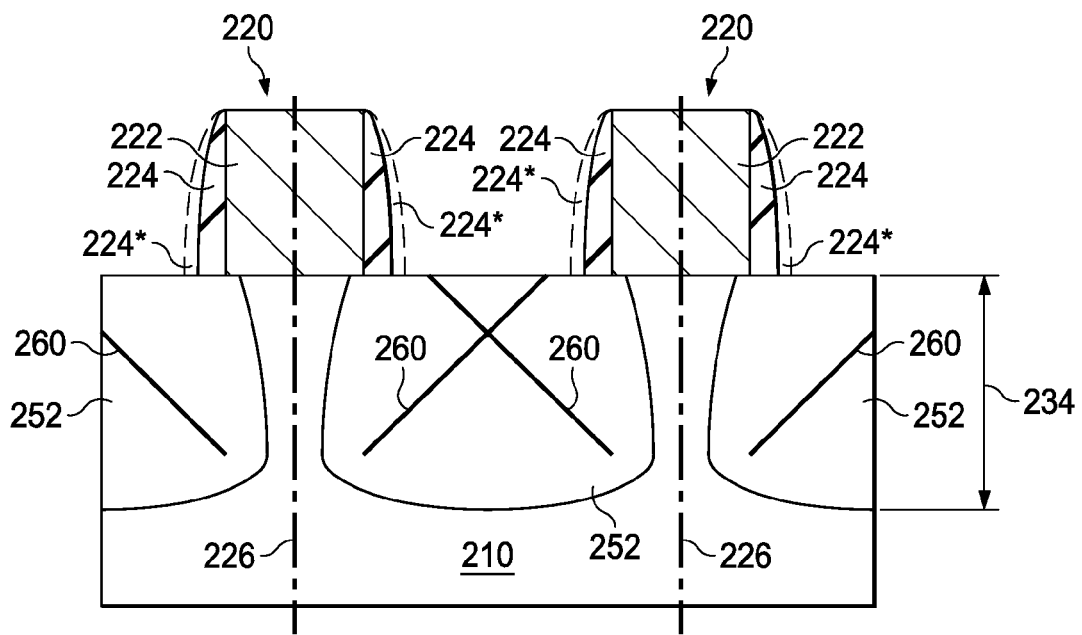

Referring to FIG. 5, the stress film 240 is removed from the substrate 210, in some embodiments. In some embodiments, the gate spacers 224 are also removed from the gate structure 220. The stress film 240 and optionally the gate spacers 224 are removed by an etching process. In some embodiments, the etching process is performed by wet etching, such as by using phosphoric acid or hydrofluoric acid, or by dry etching using suitable etchant. In some embodiments, the stress film 240 is not removed and is used as a contact etch stop layer (CESL).

After the stress film 240 is removed, optional dummy spacers 224* are formed on gate structure 220, in accordance with some embodiments. In some embodiments, the dummy spacers 224* are used to define the distances of subsequently formed doped regions from the channel regions. In some embodiments, the dummy spacers 224*, similar to gate spacers 224, are formed over the gate spacers 224 by any suitable process to any suitable thickness. The dummy spacers 224* include a dielectric material, such as silicon nitride, silicon oxide, silicon oxynitride, other suitable materials, and/or combinations thereof.

In some embodiments, the formation of spacers, PAI process, formation of stress film, annealing, and removal of stress film described above are repeated a number of times to create multiple dislocations. Further details of multiple dislocations in the stress regions 252 are found in U.S. patent application Ser. No. 13/177,309, entitled "A Semiconductor Device with a Dislocation Structure and Method of Forming the Same" and filed on Jul. 6, 2011, which is incorporated herein by reference in its entirety.

Figure 6:
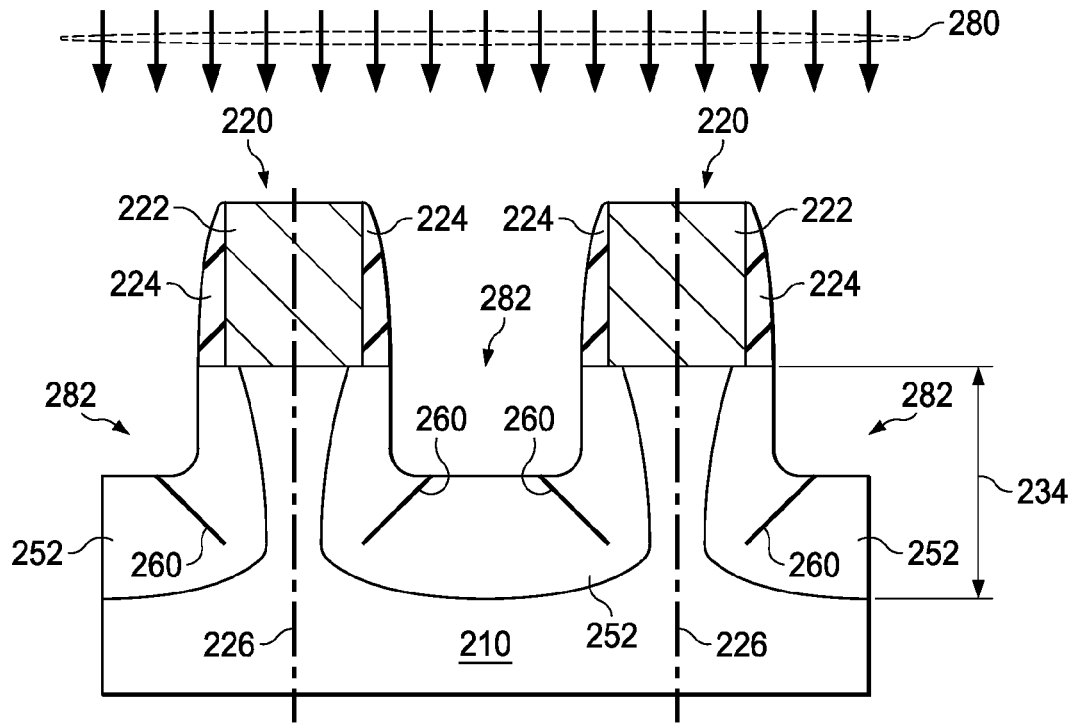

Afterward the stress film 240 is removed, recess regions are formed by etching process(es). In some embodiments, the etching process includes a dry etching process, wet etching process, or combination thereof. In some embodiments, the etching process utilizes a combination of dry and wet etching processes. The dry and wet etching processes have tunable etching parameters, such as etchants used, etching temperature, etching solution concentration, etching pressure, source power, RF bias voltage, RF bias power, etchant flow rate, and other suitable parameters. In some embodiments, recess regions 282 are formed on substrate 210, as shown in FIG. 6 in accordance with some embodiments. In some embodiments, a patterned photoresist layer is utilized to define where the recess regions 282 are formed and protect other regions of the semiconductor device 200 from implantation damage. For example, in some embodiments, the PMOS regions are protected. In addition, the patterned photoresist layer exposes the source/drain regions, such that the source/drain regions are exposed to the dry etch process 280 (forming amorphized region 282) while the gate structure 220 (and other portions of the semiconductor device 200) are protected from the etch process 280. For example, in some embodiments, the dry etching process utilizes an etching pressure of about 1 mTorr to about 200 mTorr, a source power of about 200 W to about 2000 W, an RF bias voltage of about 0 V to about 100 V, and an etchant that includes $NF_3$, $C_{12}$, $SF_6$, He, Ar, $CF_4$, or combinations thereof.

Figure 7:
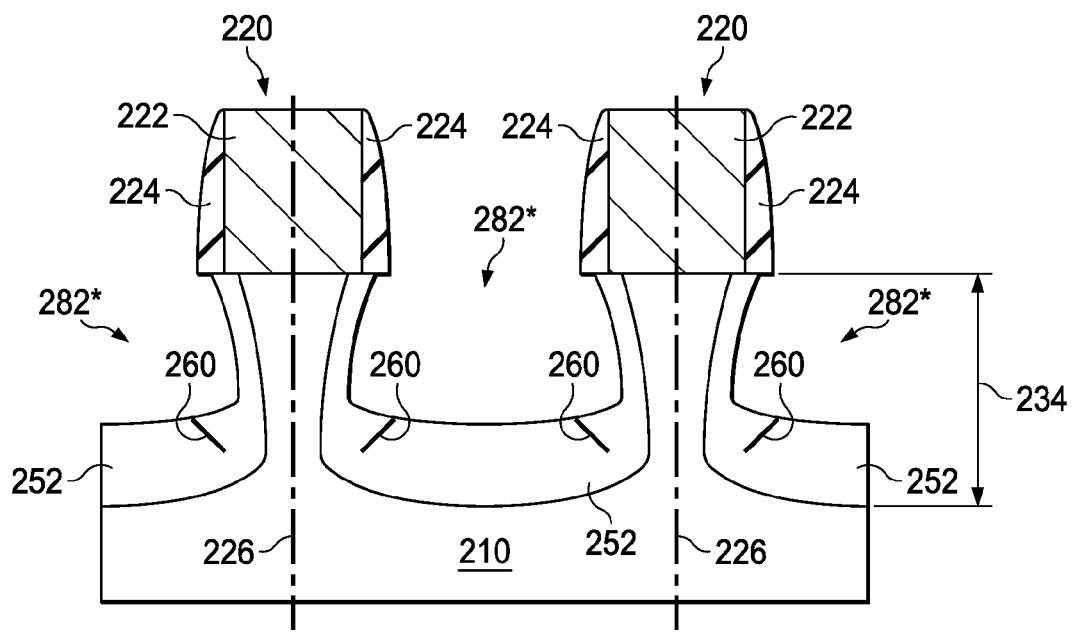

After the etch process 280 is performed, the photoresist on substrate 210 is removed. After the recess regions 282 are formed, substrate 210 undergoes a wet etch to form recess regions 282*, as shown in FIG. 7, in accordance with some embodiments. In some embodiments, the wet etching solutions include $N_{H4}OH$, HF (hydrofluoric acid), TMAH (tetramethylammonium hydroxide), other suitable wet etching solutions, or combinations thereof.

In some embodiments, the recess regions 282* have depths in a range from about 100 Å to about 800 Å. The widths of recess regions 282* near surface of substrate 210 are in a range from about 20 nm to about 200 nm. As mentioned above, in some embodiments, the widths of recess regions 282* extend under spacer 224, 224* (not shown in FIG. 7), or a combination thereof.

Figure 8:
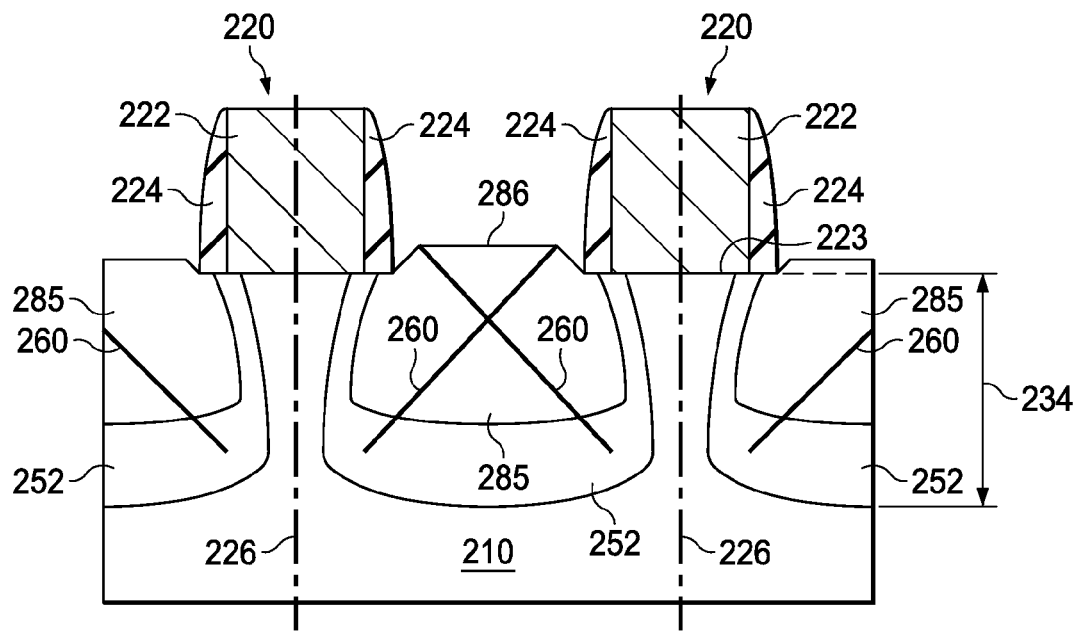

Afterwards, another silicon-containing epitaxial structure 285 is formed in each of the recesses 282*, as shown in FIG. 8, in accordance with some embodiments. The silicon-containing structure 285 is formed by performing an epitaxial deposition process to form a silicon-containing epitaxial material, in some embodiments. In some embodiments, the silicon-containing epitaxial material includes SiC, SiCP, SiP or other material that produces tensile strain on the transistor channel region. In some embodiments, the silicon-containing material is formed by using a silicon-containing precursor. For example, in some embodiments, gases, such as silane ($SiH_4$), disilane ($Si_2H_6$), trisilane ($Si_3H_8$), dichlorosilane ($SiH_2C_{12}$), etc., are used to form SiC-containing epitaxial material in structure 285. In some embodiments, phosphorous-containing gas, such as phosphine ($PH_3$), is used to form SiP epitaxial material or to form SiCP with a carbon-containing gas. In other embodiments forming P-type transistors, the silicon-containing epitaxial material includes any material, such as SiGe, that produces compressive strain on the transistor channel region.

In some embodiments, the surface 286 of the silicon-containing epitaxial structure 285 is level with or higher than the surface 223 (or interface 223) of the substrate 210 and the gate structure 220. In some embodiments, the surface 286 has a height of up to about 300 Å above the substrate surface 223. Since the silicon-containing epitaxial structure 285 is also epitaxial, the dislocations 260 continue in structure 285, as shown in FIG. 8, in accordance with some embodiments.

In some embodiments, the silicon-containing epitaxial material is formed by chemical vapor deposition (CVD), e.g., low pressure CVD (LPCVD), atomic layer CVD (ALCVD), ultrahigh vacuum CVD (UHVCVD), reduced pressure CVD (RPCVD), any suitable CVD, molecular beam epitaxy (MBE) process, any suitable epitaxial process; or any combinations thereof. In some embodiments, the deposition of the silicon-containing epitaxial material has a deposition temperature of about 750° C. or less. In other embodiments, the etching temperature ranges from about 500° C. to about 750° C. In some embodiments, the pressure of the deposition process ranges from about 50 Torr to about 500 Torr.

Alternatively, the silicon-containing epitaxial material is formed by performing an epitaxial deposition process to form a silicon-containing epitaxial material. Details of such process are described in U.S. patent application Ser. No. 13/029,378, entitled "Integrated Circuits and Fabrication Methods Thereof", and filed on Feb. 17, 2011.

In some embodiments, the semiconductor device 200 undergoes further CMOS or MOS technology processing to form various features known in the art. For example, in some embodiments, the method 100 proceeds to form main spacers. In some embodiments, contact features, such as silicide regions, are also formed. The contact features include silicide materials, such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable conductive materials, and/or combinations thereof. In some embodiments, the contact features are formed by a process that includes depositing a metal layer, annealing the metal layer such that the metal layer is able to react with silicon to form silicide, and then removing the non-reacted metal layer. In some embodiments, an inter-level dielectric (ILD) layer is further formed on the substrate 210 and a chemical mechanical polishing (CMP) process is further applied to the substrate to planarize the substrate. Further, in some embodiments, a contact etch stop layer (CESL) is formed on top of the gate structure 220 before forming the ILD layer.

In an embodiment, the gate stack 222 remains polysilicon in the final device. In another embodiment, a gate replacement process (or gate last process) is performed, where the polysilicon gate stack 222 is replaced with a metal gate. For example, a metal gate replaces the gate stack (i.e., polysilicon gate stack) of the gate structure 220. The metal gate includes liner layers, work function layers, conductive layers, metal gate layers, fill layers, other suitable layers, and/or combinations thereof. The various layers include any suitable material, such as aluminum, copper, tungsten, titanium, tantalum, tantalum aluminum, tantalum aluminum nitride, titanium nitride, tantalum nitride, nickel silicide, cobalt silicide, silver, TaC, TaSiN, TaCN, TiAl, TiAlN, WN, metal alloys, other suitable materials, and/or combinations thereof.

In some embodiments, subsequent processing further forms various contacts/vias/lines and multilayer interconnect features (e.g., metal layers and interlayer dielectrics) on the substrate 210, configured to connect the various features or structures of the semiconductor device 200. In some embodiments, the additional features provide electrical interconnection to the device. For example, a multilayer interconnection includes vertical interconnects, such as conventional vias or contacts, and horizontal interconnects, such as metal lines. In some embodiments, the various interconnection features implement various conductive materials including copper, tungsten, and/or silicide. In one example, a damascene and/or dual damascene process is used to form a copper related multilayer interconnection structure.

The dislocations in the source and drain regions and the strain created by the doped epitaxial materials next to the channel region of a transistor both contribute to the strain in the channel region. As a result, the device performance is improved. In some embodiments, the NMOS transistor performance is increased by about 10-25%.

The disclosed semiconductor device 200 is used in various applications such as digital circuit, imaging sensor devices, a hetero-semiconductor device, dynamic random access memory (DRAM) cell, a single electron transistor (SET), and/or other microelectronic devices (collectively referred to herein as microelectronic devices). Of course, aspects of the present disclosure are also applicable and/or readily adaptable to other type of transistor, including single-gate transistors, double-gate transistors, and other multiple-gate transistors, and may be employed in many different applications, including sensor cells, memory cells, logic cells, and others.

The multi-stage MWA mechanism described above may also be used to anneal defects in crystalline (or epitaxial) structures and their interfaces. The defects may be caused by growing epitaxial layer over a crystalline layer (or substrate), by doping, or by implant. For example, defects formed by epitaxial growth in the source and drain regions of NMOS and PMOS over crystalline substrates, by dopant implants or by forming isolation structures in the crystalline substrates can by annealed by MWA at a relatively low temperature, such as equal to or less than about 600° C. The defects caused by dopants in the source and drain regions and neighboring channel regions may also be annealed by MWA. Defects caused by pocket implant or doping of the lightly doped source and drain (LDD) may also be annealed by MWA. Further, defects in NMOS well, PMOS well, and channel, and defects caused by anti-punch through implant and source/drain implants may also be annealed by MWA.

Figure 11:
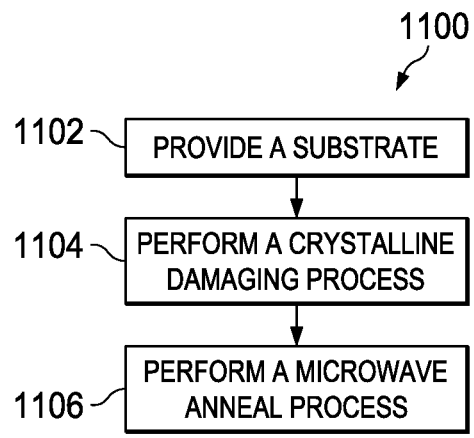
FIG. 11 shows a method of annealing a substrate by MWA, in accordance with some embodiments.

FIG. 11 shows a method 1100 of annealing a substrate by MWA, in accordance with some embodiments. The method 1100 begins with operation 1102 in which a substrate is provided. In some embodiments, the substrate has crystalline layers and/or structures. In some embodiments, the substrate is brand new and does not have any processes related to forming devices performed on the substrate. In some embodiments, the substrate includes a gate structure with a gate stack. The method 1100 continues with operation 1104 in which a crystalline damaging process is performed on the substrate. The crystalline damaging process may refer to any processes that would result in damaging the crystalline structure(s) of or on the substrate. The crystalline structures of or on the substrate could come with the substrate provided or be formed over the substrate. As described above, the crystalline damaging may be a doping process, which introduces dopants with that disrupts the crystalline structure(s) of the substrate. The doping process could be an implant process, such as PAI described above or a dopant implant process, or a diffusion process, which moves the dopants into the crystalline portions of the substrate by diffusion. Alternatively, the doping process could be epitaxial growth process, which may incorporate dopants during the film growth process. Even if the epitaxial growth does not incorporate dopants, the process could still introduce interfacial mis-match and structural defects.

The crystalline damaging process may also be an etching process, which disrupts the crystalline structure(s). The crystalline damaging process may also be a deposition process, which deposits an amorphous film over a crystalline structure(s), which introduces crystalline defects at the surface of the crystalline structures. For example, STI structures are formed in the substrates by etching shallow trenches and filling the etched shallow trenches by deposited films. The processes of forming the STI structures and the existence of the structures introduce and/or create defects in the crystalline substrate. The crystalline damaging processes described above are merely examples. Other applicable processes may also benefit from the mechanisms described here. The method 100 continues at operation 1106 in which a microwave anneal (MWA) process is performed on the substrate. The MWA process reduces or removes the defects created by the crystalline damaging process. In some embodiments, the MWA process is described in the MWA system described above. In some embodiments, the MWA process is a multi-stage anneal process. In some embodiments, the process condition of the MWA process is similar to the one described above.

Additional processing could be performed before the crystalline damaging process 1102 to form structures. For example, STI and/or gate structures could be formed. Additional processing may also be performed after the crystalline damaging process 1102 and before the MWA process 1106. Further, after the MWA process 1106 is performed, the substrate may undergo further processing to complete the device formation.

Figure 12:
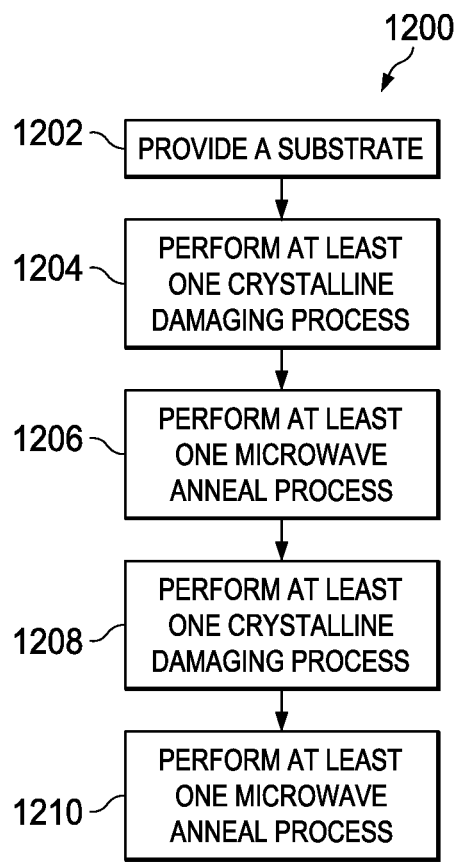
FIG. 12 shows a method of annealing a substrate by MWA, in accordance with some embodiments.

In some embodiments, multiple MWA processes are performed during the device manufacturing process. FIG. 12 shows a method 1200 of annealing a substrate by MWA, in accordance with some embodiments. Method 1200 expands the defect-repairing mechanisms of method 1100. The method 1200 begins with operation 1202 in which a substrate is provided. The method proceeds to operation 1204, during which at least one crystalline damaging process is performed. There could be two or more crystalline damaging processes performed during this operation. Afterwards, the method proceeds to operation 1206, during which at least one MWA process is performed. There could be two or more MWA processed performed. The MWA process(es) performed could be single-stage or multi-stage MWA process(es). Two or more MWA processes could be needed to ensure all or most of the defects removed. FIG. 12 shows that after the MWA process(es) of operation 1206, at least one crystalline damaging process is performed at operation 1208, in some embodiments. There are many process operations in semiconductor device manufacturing. Many processing operations could introduce damages to crystalline. The additional damages and may be some residual damages left from previous operations are repaired by the at least one MWA process(es) in operation 1210.

For example, the crystalline damaging process(es) of operation 1204 could include STI formation processes and/or gate formation process, which introduce crystalline damages. These crystalline damages are repaired by the MWA process(es) in operation 1206. The crystalline damaging process(es) of operation 1208 may include pocket implant and/or source/daring formation processes. The crystalline damages incurred from operation 1208 are repaired by the MWA process(es) of operation 1210.

The multi-stage MWA process described above could be a two-stage process, as shown in FIGS. 9 and 10A-10D. However, the multi-stage MWA process can have more than two stages. For examples, it could have 3 stages or more. Additional stage(s) could be used to prepare the wafer before heating the substrate for the high temperature annealing at the temperature range of 500° C. to 600° C. Additional stage(s) may also be used to cool down the substrate.

The embodiments of processes and structures described above provide mechanisms for annealing defects by microwave anneal (MWA). MWA causes ionic/atomic (ionic and/or atomic) polarization, electronic polarization, and/or interfacial polarization in a substrate with dopants, damages, and interfaces in crystalline structures. The polarizations make the local temperatures higher than the substrate temperature. As a result, MWA can remove damages at a relatively low substrate temperature than other anneal mechanisms and is able to prevent undesirable dopant diffusion. The relatively low substrate temperature also makes MWA compatible with advanced processing technologies which demands lower substrate temperatures during front-end processing. MWA used in annealing defects (or damages) created in forming source and drain regions improves NMOS transistor performance.

In some embodiments, a method of forming a semiconductor device is provided. The method includes providing a substrate, and performing at least one crystalline damaging process. The method also includes performing at least one microwave anneal (MWA) process, and one of the at least one microwave anneal process is a multi-stage MWA process.

In some other embodiments, a method of forming a semiconductor device is provided. The method includes providing a substrate and performing a pre-amorphous implantation (PAI) process to form an amorphized region on the substrate. The method also includes forming a stress film over the substrate, and performing a multi-stage MWA process to recrystallize the amorphized region after the stress film is formed.

In yet some other embodiments, a method of forming a semiconductor device is provided. The method includes providing a substrate, performing at least one crystalline damaging process, and performing at least one microwave anneal (MWA) process. One of the at least microwave anneal process is a multi-stage MWA process. The method also includes performing an additional one crystalline damaging process, and performing an additional MWA process.

The above disclosure provides many different embodiments, or examples, for implementing different features of the invention. Specific examples of components and arrangements are described above to simplify the present disclosure. These are, of course, merely examples and are not intended to be limiting. Accordingly, the components disclosed herein may be arranged, combined, or configured in ways different from the exemplary embodiments shown herein without departing from the scope of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
   forming an amorphized region on a substrate by performing at least one crystalline damaging process; and
   recrystallizing the amorphized region by performing at least one microwave anneal (MWA) process, wherein:
   one of the at least one microwave anneal process is a multi-stage MWA process;
   recrystallizing the amorphized region comprises at least partial recrystallization in a first stage of the multi-stage MWA process at a first temperature; and
   recrystallizing the amorphized region further comprises at least partial recrystallization in a second stage of the multi-stage MWA process at a second temperature different than the first temperature.

2. The method of claim 1, wherein two or more crystalline damaging processes are performed.

3. The method of claim 1, wherein the one of the at least one microwave anneal process is performed in a microwave anneal system with a top susceptor and a bottom susceptor.

4. The method of claim 3, wherein the top susceptor and the bottom susceptor are made of an energy converting material with a loss tangent in a range from about 0.1 to about 2.

5. The method of claim 1, wherein a frequency of the multi-stage MWA process is in a range from about 5 GHz to about 10 GHz.

6. The method of claim 1, wherein the second stage of the multi-stage MWA process has a power in a range from about 3000 watts to about 7000 watts.

7. The method of claim 1, wherein a substrate temperature of the first stage of the multi-stage MWA process is in a range from about 350° C. to about 500° C.

8. The method of claim 3, wherein a substrate temperature of the first stage of the multi-stage MWA process is in a range from about 350° C. to about 500° C.

9. The method of claim 1, wherein the first stage of the multi-stage MWA process has a power in a range from about 1000 watts to about 10000 watts.

10. The method of claim 1, wherein a substrate temperature of the second stage of the multi-stage MWA process is in a range from about 500° C. to about 600° C.

11. The method of claim 1, wherein a substrate temperature of the second stage of the multi-stage MWA process is in a range from about 350° C. to about 500° C., wherein the second stage is after the first stage of the multi-stage MWA process.

12. The method of claim 1, wherein two or more MWA processes are performed.

13. The method of claim 1, wherein the semiconductor device includes a fin-type field-effect transistor.

14. The method of claim 1, wherein the performing at least one crystalline damaging process includes at least one of etching, implant, pre-amorphous implantation (PAI), doping, deposition, or epitaxial growth processes.

15. The method of claim 1, wherein the performing at least one crystalline damaging process is used to form at least one of a shallow trench isolation structure, a gate structure, a pocket implant, a lightly doped source/drain (LDD), source/drain, NMOS well, PMOS well, channel, anti-punch through implant, or source/drain implants.

16. The method of claim 1, further comprising:
performing an additional one crystalline damaging process; and
performing an additional MWA process.

17. The method of claim 1, wherein a defect density of a crystalline structure of the substrate is less than about 1E7 1/cm$^2$.

18. A method of forming a semiconductor device, comprising:
performing a pre-amorphous implantation (PAI) process to form an amorphized region on a substrate;
forming a stress film over the substrate; and
recrystallizing the amorphized region to produce a recrystallized region by performing a multi-stage MWA process after the stress film is formed, wherein:
recrystallizing the amorphized region comprises at least partial recrystallization in a first stage of the multi-stage MWA process at a first temperature; and
recrystallizing the amorphized region further comprises at least partial recrystallization in a second stage of the multi-stage MWA process at a second temperature different than the first temperature.

19. The method of claim 18, wherein the recrystallized region includes at least one dislocation.

20. The method of claim 18, wherein a substrate temperature during the multi-stage MWA process is equal to or less than about 600° C.

21. The method of claim 18, further comprising:
forming a recess region on the substrate, wherein the recess region overlies the recrystallized region; and
forming an epitaxial stress-inducing material in the recess region.

22. The method of claim 18, wherein a defect density of a crystalline structure of the substrate is less than about 1E7 1/cm$^2$.

23. A method of forming a semiconductor device, the method comprising:
providing a substrate;
performing at least one crystalline damaging process;
performing at least one microwave anneal (MWA) process to recrystallize an amorphized region, wherein one of the at least one microwave anneal process is a multi-stage MWA process, and recrystallizing the amorphized region comprises at least partial recrystallization in a first stage of the multi-stage MWA process and at least partial recrystallization in a second stage of the multi-stage MWA process; and
performing an additional one crystalline damaging process; and performing an additional MWA process.

24. The method of claim 23, wherein:
the performing at least one crystalline damaging process comprises forming at least one amorphized region on the substrate;
the performing at least one MWA process comprises at least partially recrystallizing at least one amorphized region in a first stage of the multi-stage MWA process at a first temperature; and
the performing at least one MWA process further comprises at least partially recrystallizing at least one amorphized region in a second stage of the multi-stage MWA process at a temperature different from the first stage.

25. The method of claim 23, wherein:
the performing at least one crystalline damaging process comprises forming at least one amorphized region on the substrate;
the performing at least one MWA process comprises at least partially recrystallizing at least one amorphized region;
the performing an additional one crystalline damaging process comprises forming an additional one amorphized region on the substrate; and
the performing an additional MWA process comprises at least partially recrystallizing the additional one amorphized region.

* * * * *